United States Patent [19]
Ajit

[11] Patent Number: 5,910,664
[45] Date of Patent: Jun. 8, 1999

[54] EMITTER-SWITCHED TRANSISTOR STRUCTURES

[75] Inventor: Janardhanan S. Ajit, Sunnyvale, Calif.

[73] Assignee: International Rectifier Corporation

[21] Appl. No.: 08/964,868

[22] Filed: Nov. 5, 1997

Related U.S. Application Data

[60] Provisional application No. 60/030,210, Nov. 5, 1996.
[51] Int. Cl.[6] .......................... H01L 23/58; H01L 29/74; H01L 29/76; H01L 29/94
[52] U.S. Cl. ........................ 257/212; 257/139; 257/140; 257/146; 257/147; 257/341; 257/342
[58] Field of Search .................................. 257/139, 140, 257/146, 147, 167, 168, 339, 341, 342, 212

[56] References Cited

U.S. PATENT DOCUMENTS 5,065,213  11/1991  Frisina et al. ............................ 257/139
5,118,635  6/1992  Frisina et al. ............................ 257/139

*Primary Examiner*—Steven H. Loke
*Attorney, Agent, or Firm*—Ostrolenk, Faber, Gerb & Soffen, LLP

[57] ABSTRACT

Emitter-switched transistor structures are described which have only three terminals. A part of the drain current is used to provide the base current of an emitter-switched NPN transistor and to concurrently cause the injection of holes to conductivity-modulate the emitter-switching MOSFET of the NPN transistor. The reduced on-resistance of the emitter-switching MOSFET causes the emitter-switched NPN transistor to inject more electrons, which in turn leads to more hole injection via a positive feedback mechanism, resulting in a low on-state voltage drop for the device. In another embodiment of the invention, a thyristor structure is provided with the anode switched by a high-voltage MOSFET. Yet another embodiment of the invention provides a four terminal bidirectional device with no diffusions required on the backside of the wafer.

17 Claims, 7 Drawing Sheets

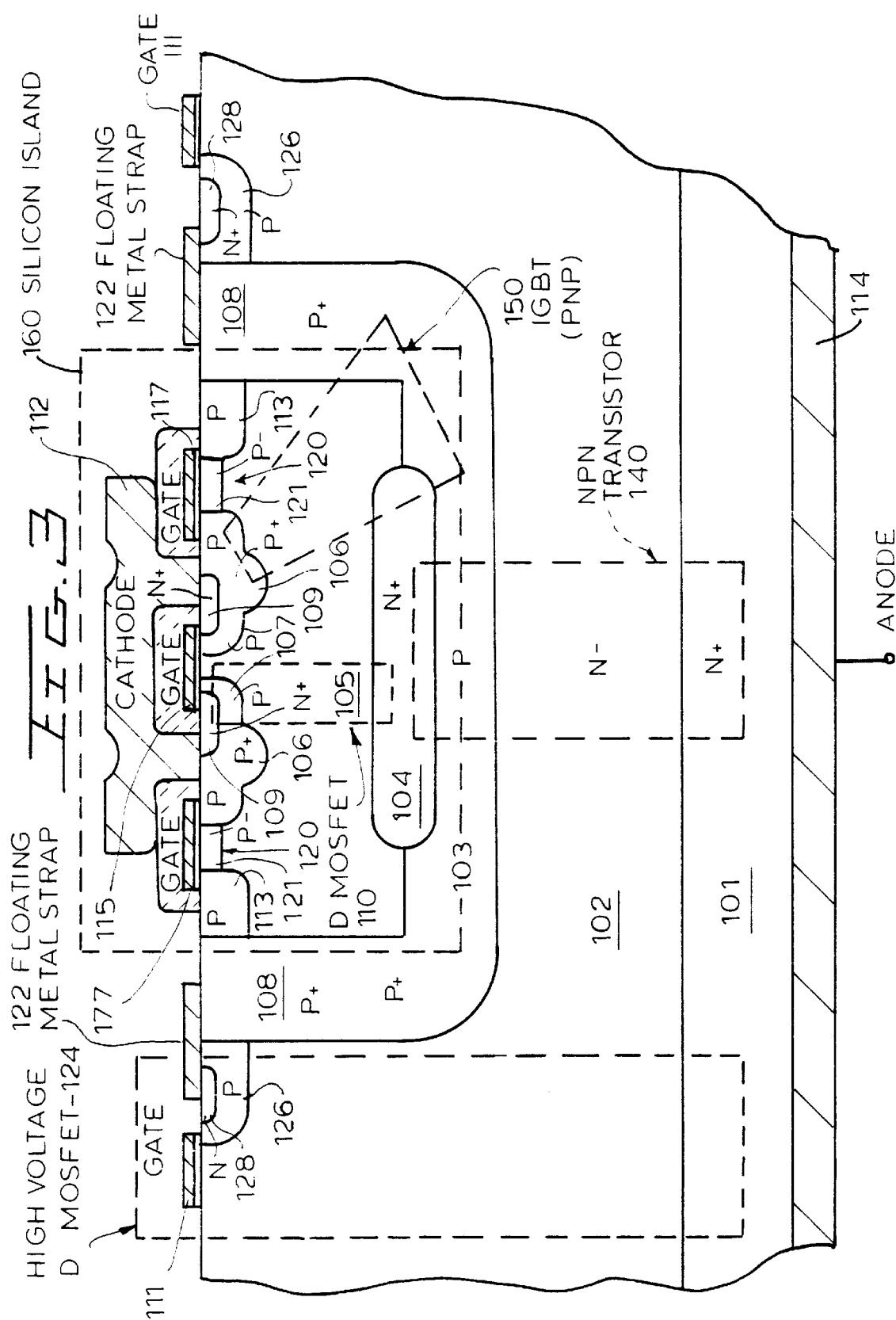

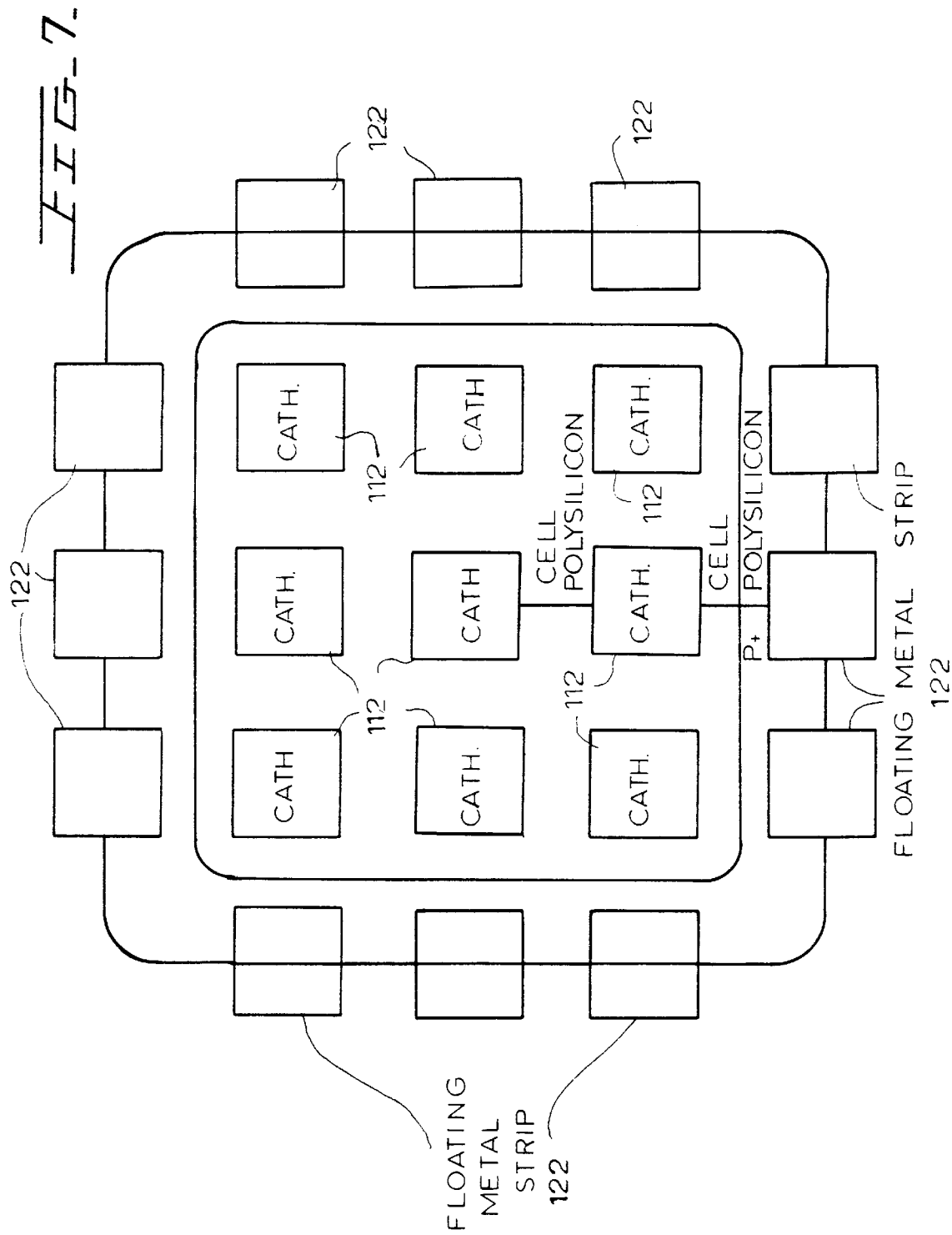

EMITTER-SWITCHED TRANSISTOR STRUCTURES

RELATED APPLICATIONS

This application claims the priority of Provisional Application Ser. No. 60/030,210, filed Nov. 5, 1996.

BACKGROUND OF THE INVENTION

The present invention relates to emitter-switched transistor structures and, more specifically, to emitter-switched insulated gate bipolar transistor (IGBT) and emitter-switched thyristor structures.

Emitter-switching is directed to a circuit configuration in which a low-voltage MOS power transistor cuts off the emitter current of a high-voltage bipolar power transistor. Such a structure is disclosed, for example, in U.S. Pat. No. 5,118,635 which is incorporated herein by reference.

The structure of the prior art emitter-switched transistor of U.S. Pat. No. 5,118,635 is shown in FIG. 1. The high voltage bipolar transistor 20 is formed by the bottom layers of the chip. Specifically, an N− conductivity epitaxial layer 2, which serves as the collector of the bipolar transistor, is grown on an N+ type substrate 1. A P+ region 3, which constitutes the base of the bipolar transistor, is formed in layer 2 and extends to the upper surface of the chip at peripheral regions 8 to allow for external connection. A buried N+ region 4, the emitter of the bipolar transistor, is provided over P+ region 3.

The low voltage vertical MOS power transistor (MOSFET) 22, which cuts off the current supplied to the emitter of the high-voltage bipolar transistor, is provided at the top surface of the chip. The MOSFET consists of a N type drain region 5 disposed over and contacting buried N+ region 4, P body regions 6, N+ source regions 7, and insulated gate 9. Metal contacts 10, 11 and 14 are provided for contact with regions 6 and 7, 8 and substrate 1, respectively.

FIG. 2 shows the equivalent circuit of the prior art structure of FIG. 1. Here, the prior art emitter-switched transistor structure has four terminals, with the base 11 of the power bipolar transistor 20 and the gate 13 of the power MOSFET transistor 22 being controlled independently of one another.

It would be advantageous to provide an emitter-switched bipolar transistor in a three-terminal configuration. It would be further advantageous to provide a conductivity modulated three-terminal emitter-switched bipolar transistor with reduced on-resistance. It would also be advantageous to provide an emitter-switched thyristor configuration with the above-noted attributes. Finally, it would be advantageous to provide an emitter-switched bidirectional power transistor.

SUMMARY OF THE INVENTION

The present invention advantageously provides emitter-switched transistor structures having the above-described desirable attributes.

More specifically, a first embodiment of the present invention includes an emitter-switched bipolar transistor in a three-terminal configuration having only a single gate drive, and which is conductivity modulated to reduce on-resistance and maximize current density in the on state.

In a second embodiment, an emitter-switched thyristor configuration is provided. In a third embodiment, a bidirectional configuration is provided. A fourth embodiment which is similar in concept to the first embodiment but different in manufacturing method is also provided.

Other features and advantages of the present invention will become apparent from the following description of the invention which refers to the accompanying drawings.

BRIEF DESCRIPTION OF THE DRAWINGS

FIG. 3 shows a cross-sectional view of a first embodiment of the present invention in which the P+ anode of an IGBT is emitter-switched by a high voltage n-channel MOSFET.

FIG. 7 shows a top view of a multiple cell implementation of the embodiments shown in FIGS. 3 and 5.

DETAILED DESCRIPTION OF THE PREFERRED EMBODIMENTS

Figure 1:
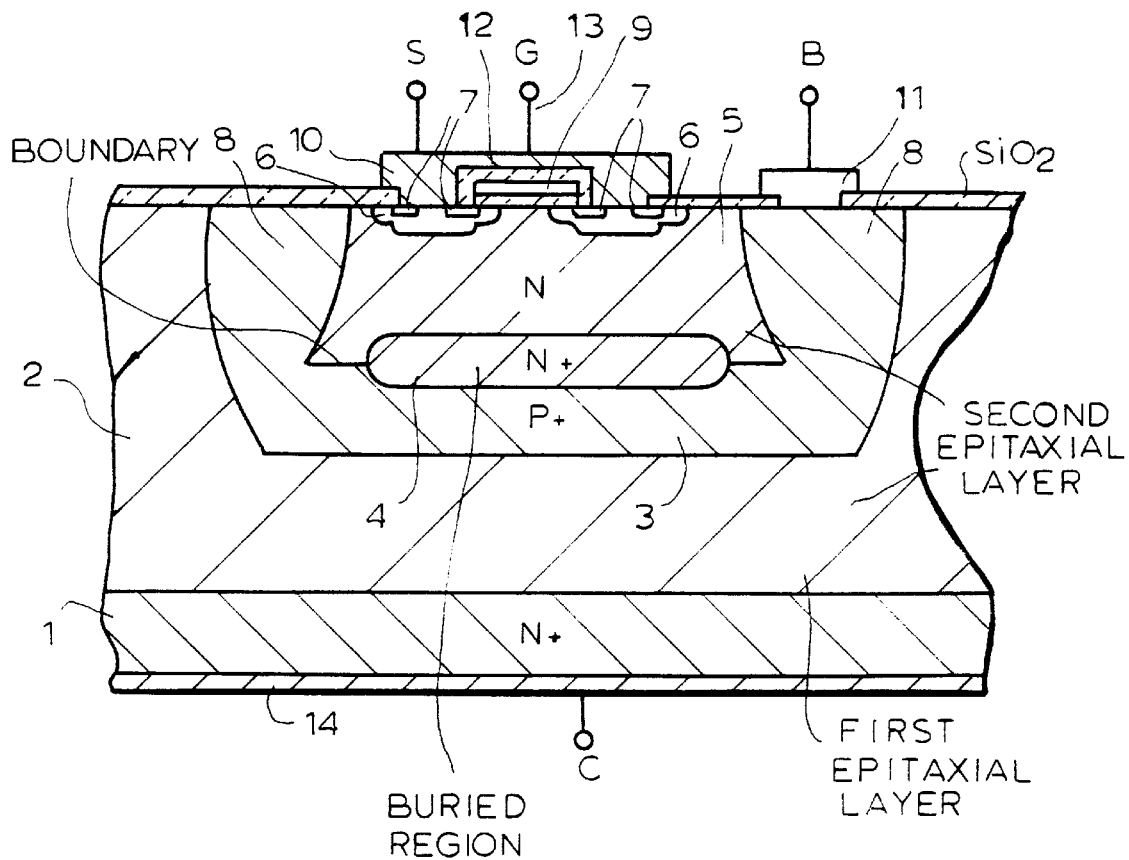
FIG. 1 shows a cross-sectional view of the structure of the prior art emitter-switched transistor.
Figure 2:
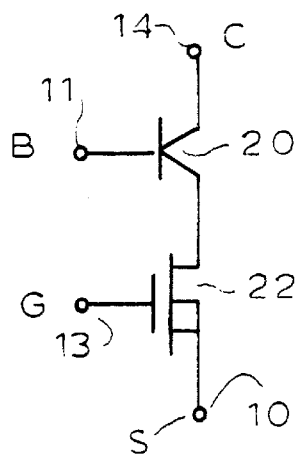
FIG. 2 shows the equivalent circuit of the prior art emitter-switched transistor of FIG. 1.

A first embodiment of the present invention is shown in FIG. 3. The structure of the device shown in FIG. 3 includes a NPN transistor 140 and DMOSFET 110 that are similar to the transistor 20 and DMOSFET 22 shown in FIG. 1. The NPN transistor 140 includes a collector formed of N+ substrate 101 and N− epitaxial layer 102, a base formed of a P+ region 103 and a contact region 108 to the upper surface, and an emitter formed of N+ region 104. The DMOSFET 110 includes a drain formed of N+ region 104 and N region 105, a base formed of P+ region 106 and lightly doped P channel region 107, and a source formed of N+ region 109.

According to the invention, the structure includes islands 160 of silicon formed inside regions 108 and 103. Each silicon island 160 includes an emitter-switched IGBT 150 which includes a PNP structure formed at P body regions 106 and 107, N region 105 and P regions 103 and 108. The structure further includes, at the upper surface, a lateral p-channel depletion mode MOSFET 120 having a drain formed at P body regions 106 and 107, a source formed at P region 113 and a depletion channel formed of P− region 121. The MOSFET 120 couples the P base region 103 of the NPN bipolar transistor 140 to the P body region 107 of the MOSFET when the gate 117 goes negative for fast turn-off of the structure. The structure also includes a floating metal strap 122 and a n-channel MOSFET 124 having a N+ source region 128, a P base region 126 and a drain formed of N regions 101 and 102. The strap 122 and MOSFET 124 are located at periphery of silicon island 160 and couple the contact region 108 of the P base 103 of the NPN bipolar transistor 140 to drain region 102 when the gate 111 is positive. A contact 112 to the N+ region 109 and P region 107 forms the cathode of the device 100, and a contact to the N layer 101 forms the anode. The fabrication of the structure of the present invention is similar to that of the manufacturing process described in U.S. Pat. No. 5,118,635. The device is preferably embodied in a cellular topology, a single cell of which is depicted in FIG. 3.

Figure 4:
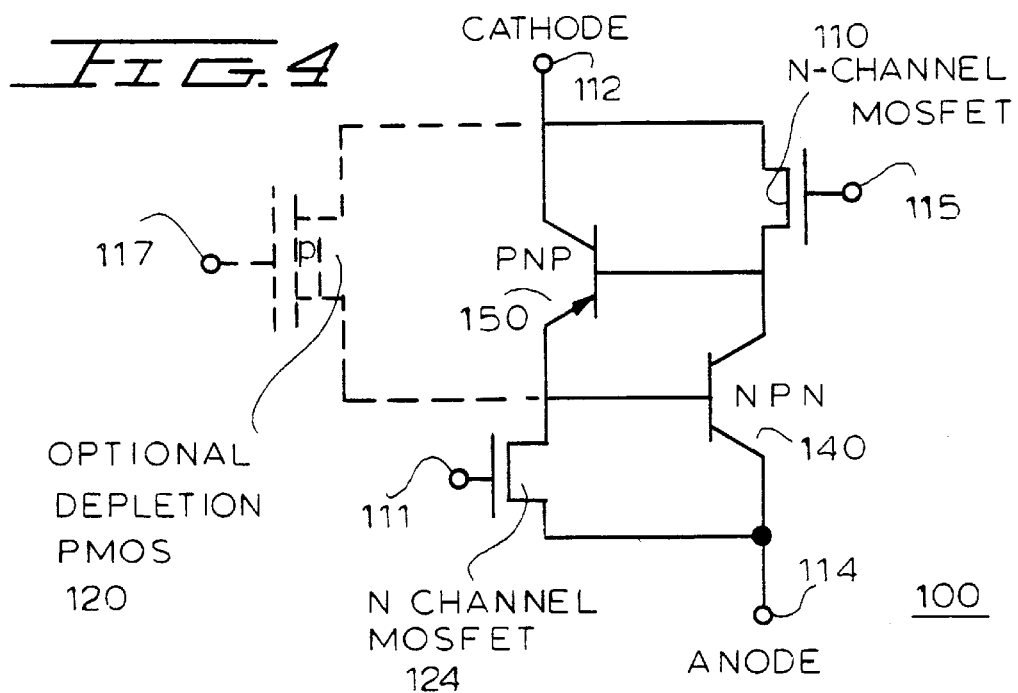
FIG. 4 shows the equivalent circuit of the emitter-switched IGBT of FIG. 3.

The operation of the first embodiment of the invention, namely the emitter-switched IGBT structure shown in FIG. 3 will now be described. FIG. 4 shows the equivalent circuit for the device of FIG. 3.

In the on-state, namely with the anode 114 at a positive potential with respect to the cathode 112, a positive gate voltage is applied to the gates 111, 115 and 117 of MOSFETs 110, 120 and 124 so that the n-channel DMOSFETs 110 and 124 are turned-on and the p-channel depletion mode MOSFET 120 is turned-off. The turn-on of the low voltage DMOSFET 110 at the center of the cell connects the buried N+ emitter 104 of the NPN transistor 140 to cathode potential, while the turn-on of the high voltage DMOSFET 124 at the periphery of the cell connects the P+ region 108 (namely the base of the NPN transistor 140 and the emitter of the IGBT 150) to the anode, thereby forward biasing the junction between P+ regions 103 and 108 and N+ region 104.

The forward biasing of the P+/N+ junction causes electrons to flow through the P layer 103 and down to the N− region 102, so that the N− region 102 is conductivity modulated by electrons, which decreases the resistance of the path between the P layer 103 and the anode 114 through the high voltage DMOSFETs 124 at the periphery of the cell, thereby increasing the potential of the P region 103. Similarly, N region 105 is conductivity modulated with holes flowing upward from the P region 103, which decreases the resistance of the low voltage DMOSFET 110 in the center of the cell, thereby lowering the potential of the N region 105. The injected holes also provide increased base drive for the NPN transistor 140.

The above-described conductivity modulation processes feed off each other using positive feedback because as the potential of the P region 103 increases while the resistance in the path to the anode decreases, the P region 103 injects more holes upward, causing the potential of the N+ region 104 to decrease while the resistance in the path to the cathode 112 decreases, such that the N+ region 104 sends more electrons downward. Advantageously, the conductivity modulation feature of the present invention ensures a high current density in the on-state. The emitter-switching utilized in the present invention, where the channel current limits conduction, also allows for full gate control.

To turn off the device, the gates of MOSFETs 110, 120 and 124 are brought to zero or negative potential, which disconnects the N+ region 104 from the cathode 112 and disconnects the P region 103 from the anode 114. The lateral depletion mode MOSFET 120 thus connects the P+ region to the cathode potential, namely the ground potential, in the off state to achieve a higher breakdown voltage. The P− region 120 facilitates this connection.

Advantageously, in the present invention, all of the gates are tied together so that the device may operate with only three terminals.

Figure 5:
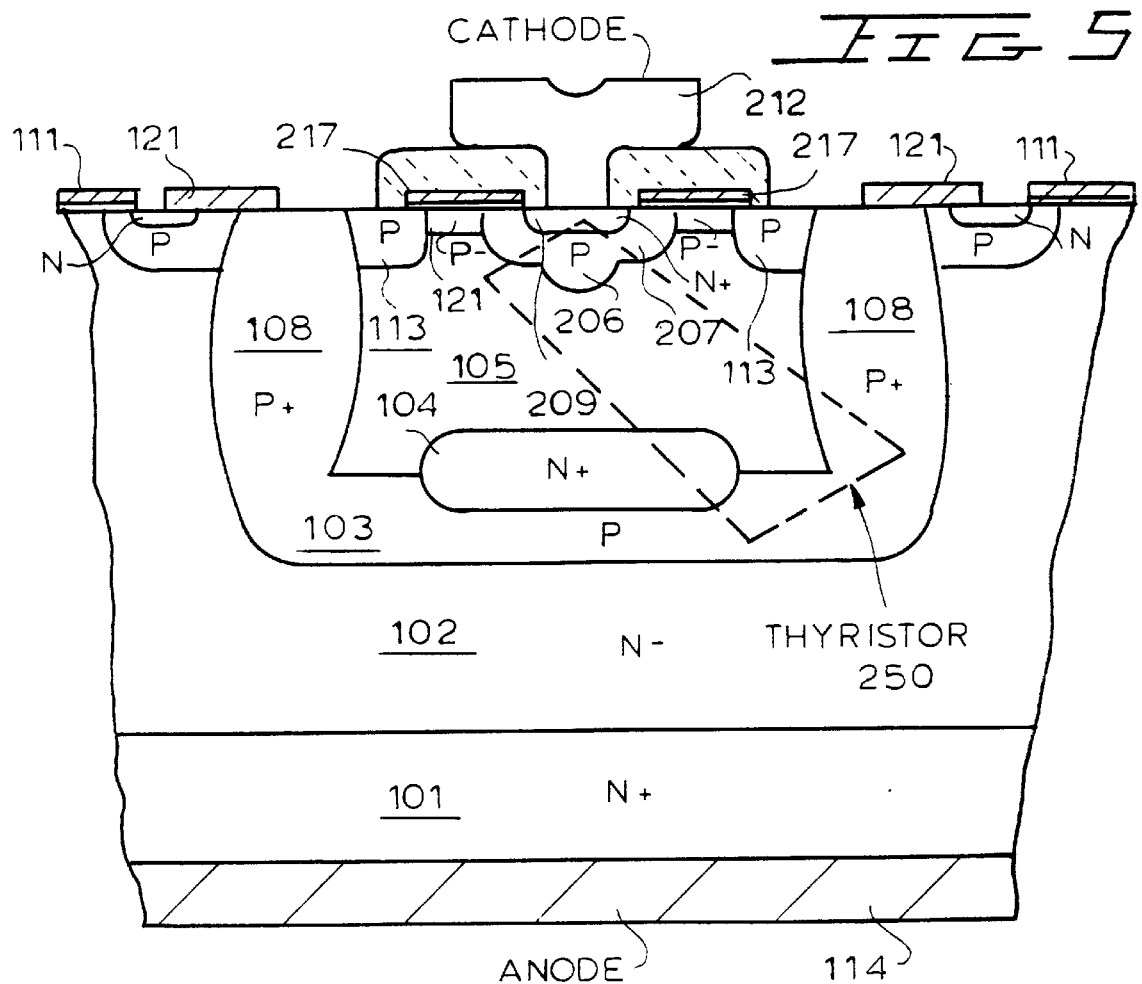
FIG. 5 shows a cross-sectional view of a second embodiment of the present invention in which the P+ anode of a thyristor is emitter-switched by a high voltage n-channel MOSFET.

A second embodiment of the present invention in which the structure of the device is configured to include an emitter-switched thyristor 250 formed of N+ 209, P regions 206 and 207, N regions 105 and 104, and P regions 103 and 108 shown in FIG. 5, wherein like elements from FIG. 3 are indicated by corresponding reference numerals.

Figure 6:
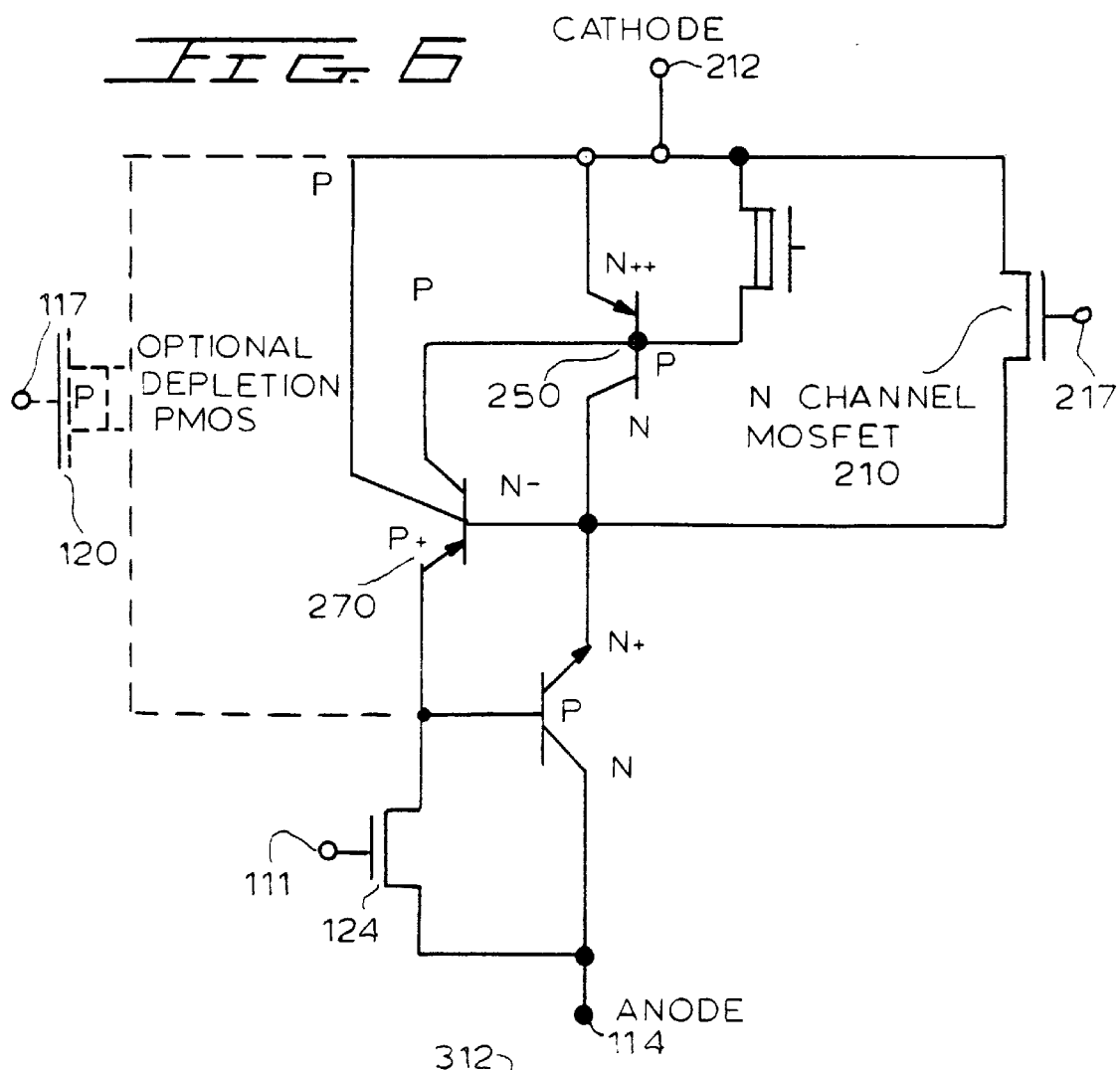
FIG. 6 is the equivalent circuit of the emitter-switched resistor of FIG. 5.

In this embodiment of the invention, the deep P+ region of the low voltage DMOSFET 110 of FIG. 3 is eliminated to increase the resistance of the P base 206 to intentionally form a latch up transistor 270 formed of P regions 206 and 113 and N region 105. FIG. 6 shows the resulting equivalent circuit for the device of FIG. 5.

FIG. 7 shows a top view of the present invention as configured in the preferred cellular topology. The top view is the same for both the first and second embodiments of the present invention.

Figure 8:
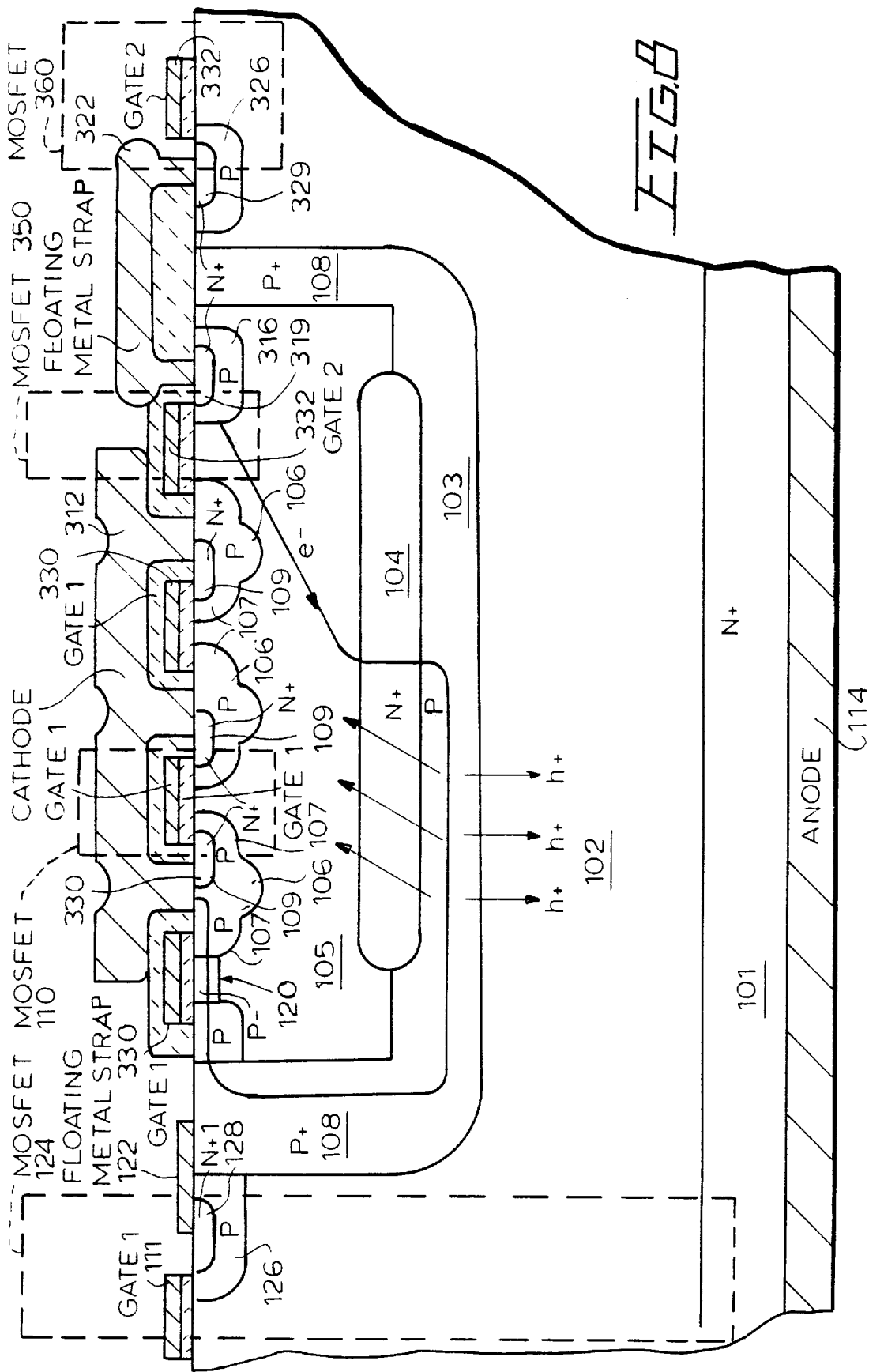
FIG. 8 is a cross-sectional view of a third embodiment of the present invention in which a bidirectional switch is controlled by two gates.

Another embodiment of the invention showing a bidirectional device configuration is shown in FIG. 8. The structure of the device is similar to that of FIG. 3 but includes another N+ diffusion region 319 and P diffusion 316 formed in N region 105 and N+ diffusion 329 and P diffusion 326 formed in N layer 102. The N+ diffusion 319 and 329 are connected by floating metal strip 322.

Figure 9:
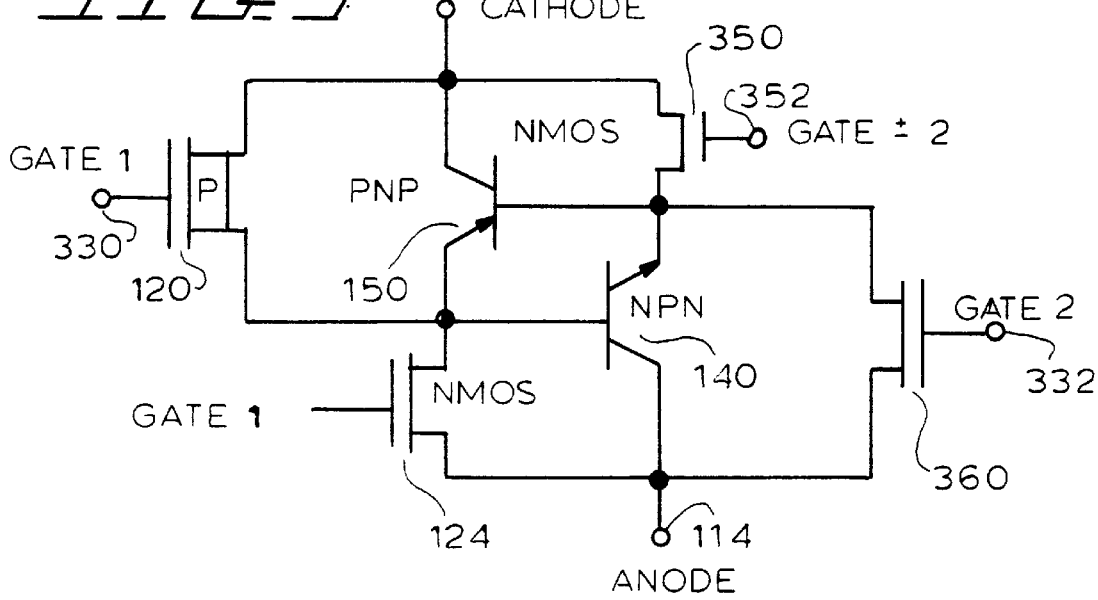
FIG. 9 shows the equivalent circuit of the bidirectional switch of FIG. 8.

FIG. 9 shows the equivalent circuit for the device of FIG. 8.

Here, two gates 330 and 332 of opposite polarity are needed. The gate 330 controls MOSFETs 110, 120 and 124, shown in FIG. 9, and the gate 332 controls added MOSFETs 350 and 360. When the first gate 330 is at a high potential and the second gate 332 is at a ground or negative potential, MOSFET 350 is turned off, and the device operates in the same manner as the device of the first embodiment shown in FIG. 3, namely the current flows from the bottom surface to the top surface.

For current to flow in the downward direction, with the anode at ground potential, the first gate 330 is held at a low potential and the second gate 332 is held at a high potential, the N+ region 104 is emitter-switched to ground (bottom) through the MOSFET 350 formed of N+ region 319 and P region 316 in series with high-voltage DMOSFET 360 formed of N+ region 329 and P region 326 located at the right side of the cell, and the P+ regions 103 and 108 are connected to the high voltage of the cathode 112 through the PMOS transistor 120. This causes holes to flow down across the P+/N+ junction from P regions 108 and 103 and the N region 102. Some of the holes also flow upwards across P/N junction from P region 108 and 103 and N region 105 and 104 and the upwardly flowing holes are diverted through the metal straps 322 downward to the anode 114 which is held at ground potential.

The current flow in the downward direction from the cathode to the anode flows through the PMOS transistor 120 to P region 108 and 103, then through forward biased PN junction formed by P regions 108 and 103 and N regions 105 and 104 and then through NMOS transistor 350 to metal strap 322 to NMOS transistor 360 to N− region 102 to N+ region 101. Current also flows from P regions 108 and 103 to N− region 102 through forward biased PN junction formed by P regions 108 and 103 and N region 102.

Figure 10:
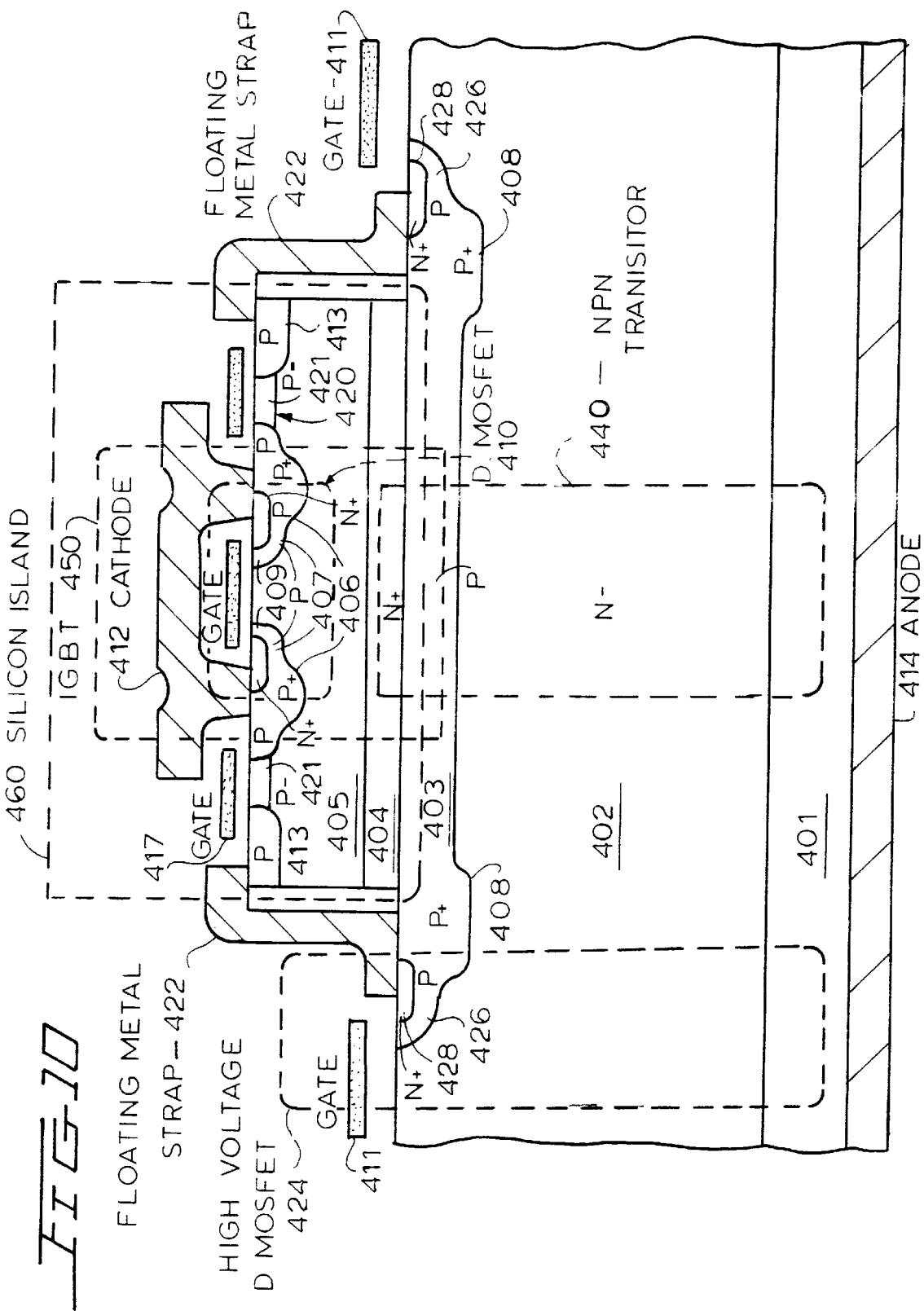
FIG. 10 shows a cross-sectional view of a fourth embodiment of the present invention.

A fourth embodiment of the present invention is shown in FIG. 10. The structure of the device 400 shown in FIG. 3 includes a NPN transistor 440 and DMOSFET 410 that are similar to the transistor 20 and DMOSFET 22 shown in FIG. 1. The NPN transistor 440 includes a collector formed of N+ substrate 401 and N− epitaxial layer 402, a base formed of a P+ region 403 and a contact region 408 to the upper surface, and an emitter formed of N+ region 404. The DMOSFET 410 includes a drain formed of N+ region 404 and N region 405, a base formed of P+ region 406 and lightly doped P channel region 407, and a source formed of N+ region 409.

According to the invention, the structure includes islands 460 of silicon formed above gap regions 408 and 403. Each silicon island 460 includes an emitter-switched IGBT 450 which includes a PNP structure formed at P body regions 406 and 407, N region 405 and P regions 403 and 408. The structure further includes, at the upper surface, a lateral p-channel depletion mode MOSFET 420 having a drain formed at P body regions 406 and 407, a source formed at P region 413 and a depletion channel formed of P⁻ region 421. The MOSFET 420 couples the P base region 403 of the NPN bipolar transistor 440 to the P body region 407 of the MOSFET when the gate 417 goes negative for fast turn-off of the structure. The structure also includes a floating metal strap 422 and a n-channel MOSFET 424 having a N+ source region 428, a P base region 426 and a drain formed of N regions 401 and 402. The strap 422 and MOSFET 424 are located below the periphery of silicon island 460 and couple the contact region 408 of the P base 403 of the NPN bipolar transistor 440 to drain region 402 when the gate 411 is positive. A contact 412 to the N+ region 409 and P region 407 forms the cathode of the device 400, and a contact to the N+ layer 401 forms the anode.

The fourth embodiment of the present invention can be fabricated in two different ways.

The first method of fabrication includes bonding two wafers of silicon and etching areas of the top wafer to form the islands of silicon 460.

The second method of fabrication consists of starting with a wafer comprising of N epitaxial layers 402 and 405 on top of an N+ substrate 401 and then forming buried layers 403 and 404. Areas of the silicon are then etched to expose part of the N⁻ epitaxial layer 402 and part of the P buried layer 403. The fabrication is then completed using conventional semiconductor photolithography, implantation, diffusion, oxidation and deposition steps. The device is preferably embodied in a cellular topology, a single cell of which is depicted in FIG. 10.

The operation of the fourth embodiment of the invention, namely the emitter-switched IGBT structure shown in FIG. 10 will now be described. The equivalent circuit for the device of FIG. 10 is the same as shown in FIG. 4.

In the on-state, namely with the anode 414 at a positive potential with respect to the cathode 412, a positive gate voltage is applied to the gates 411, 415 and 417 of MOSFETs 410, 420 and 424 so that the n-channel DMOSFETs 410 and 424 are turned-on and the p-channel depletion mode MOSFET 420 is turned-off. The turn-on of the low voltage DMOSFET 410 at the center of the cell connects the buried N+ emitter 404 of the NPN transistor 440 to cathode potential, while the turn-on of the high voltage DMOSFET 424 at the periphery of the cell connects the P+ region 408 (namely the base of the NPN transistor 440 and the emitter of the IGBT 450) to the anode, thereby forward biasing the junction between P+ regions 403 and 408 and N+ region 404.

The forward biasing of the P+/N+ junction causes electrons to flow through the P layer 403 and down to the N– region 402, so that the N– region 402 is conductivity modulated by electrons, which decreases the resistance of the path between the P layer 403 and the anode 414 through the high voltage DMOSFETs 424 at the periphery of the cell, thereby increasing the potential of the P region 403. Similarly, N region 405 is conductivity modulated with holes flowing upward from the P region 403, which decreases the resistance of the low voltage DMOSFET 410 in the center of the cell, thereby lowering the potential of the N region 405. The injected holes also provide increased base drive for the NPN transistor 440.

The above-described conductivity modulation processes feed off each other using positive feedback because as the potential of the P region 403 increases while the resistance in the path to the anode decreases, the P region 403 injects more holes upward, causing the potential of the N+ region 404 to decrease while the resistance in the path to the cathode 412 decreases, such that the N+ region 404 sends more electrons downward. Advantageously, the conductivity modulation feature of the present invention ensures a high current density in the on-state. The emitter-switching utilized in the present invention, where the channel current limits conduction, also allows for full gate control.

To turn off the device, the gates of MOSFETs 410, 420 and 424 are brought to zero or negative potential, which disconnects the N+ region 404 from the cathode 412 and disconnects the P region 403 from the anode 414. The lateral depletion mode MOSFET 420 thus connects the P+ region to the cathode potential, namely the ground potential, in the off state to achieve a higher breakdown voltage. The P– region 420 facilitates this connection.

Advantageously, in the present invention, all of the gates are tied together so that the device may operate with only three terminals.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor device comprising:

a substrate of a first conductivity type having substantially flat parallel upper and lower surfaces;

a base region of a second conductivity type formed in an upper surface of said substrate;

an active region of said first conductivity type formed in said base region at said upper surface;

at least one first body region of said second conductivity type formed in said active region at said upper surface;

at least one first source region of said first conductivity type formed in said body region at said upper surface and forming a first channel region in said body region between said first source region and said active region;

at least one first gate electrode disposed atop said upper surface and overlying and insulated from said first channel region and operable to invert said first channel region in response to a suitable gate voltage supplied thereto;

at least one cathode electrode disposed atop said upper surface and contacting said first source region;

a second body region of said second conductivity type formed in said upper surface of said substrate and being located adjacent to said base region;

a second source region of said first conductivity type formed in said second body region at said upper surface and forming a second channel region in said second body region between said second source region and said substrate;

a second gate electrode disposed atop said upper surface and overlying and being insulated from said second channel region and being operable to invert said second channel region in response to said suitable gate voltage supplied thereto;

at least one first connecting electrode disposed atop said upper surface and overlying at least a portion of said second source region, said second body region and said base region, so that when said suitable gate voltage is applied to said second gate electrode, said base region is electrically coupled to said substrate; and an anode contact formed on said lower surface of said substrate.

2. The device of claim 1 wherein said base region includes a portion adjacent to said upper surface that is more heavily doped than another portion of said base region that is adjacent to a lower boundary between said base region and said substrate.

3. The device of claim 1 wherein said active region includes a buried emitter region formed along at least a portion of a boundary between said active region and said base region and being more heavily doped than a remaining portion of said active region.

4. The device of claim 1 wherein said first body region includes a lower portion that is more heavily doped than a remaining portion that is adjacent to said upper surface.

5. The device of claim 1 wherein said cathode electrode is further disposed atop said first body region and said first source region.

6. The device of claim 1 further comprising a third source region of said second conductivity type formed in a third body region in said active region at said upper surface and being located adjacent to said base region; a depletion channel region comprising a third channel region formed in said active region at said upper surface and being located between said third source region and said first body region; and a third gate electrode disposed atop said upper surface and overlying and being insulated from said depletion channel region.

7. The device of claim 6 wherein said first, second and third gate electrodes are electrically coupled and held at a same potential.

8. The device of claim 6 further comprising a fourth body region of said second conductivity type formed in said active region at said upper surface; a fourth source region said first type formed in said fourth body region and forming a fourth channel region in said fourth body region; and a fourth gate electrode disposed atop said upper surface and overlying and being insulated from said fourth channel region.

9. The device of claim 8 further comprising a fifth body region of said second conductivity type formed in said substrate at said upper surface; a fifth source region of said first conductivity type formed in said fifth body region at said upper surface and forming a fifth channel region in said fifth body region between said fifth source region and said substrate; and a fifth gate electrode disposed atop said upper surface and overlying and being insulated from said fifth channel region.

10. The device of claim 9 further comprising a second connecting electrode for connecting said fourth and fifth source regions.

11. An emitter-switched IGBT device comprising:

a substrate of a first conductivity type having substantially flat parallel upper and lower surfaces;

a base region of a second conductivity type formed in an upper surface of said substrate;

an active region of said first conductivity type formed in said base region at said upper surface, said active region including a buried emitter region formed along at least a portion of a boundary between said active region and said base region and being more heavily doped than a remaining portion of said active region;

at least one first body region of said second conductivity type formed in said active region at said upper surface;

at least one first source region of said first conductivity type formed in said body region at said upper surface and forming a first channel region in said body region between said first source region and said active region;

at least one first gate electrode disposed atop said upper surface and overlying and insulated from said first channel region and operable to invert said first channel region in response to a suitable gate voltage supplied thereto;

at least one cathode electrode disposed atop said upper surface and contacting said first body region and said first source region;

a second body region of said second conductivity type formed in said upper surface of said substrate and being located adjacent to said base region;

a second source region of said first conductivity type formed in said second body region at said upper surface and forming a second channel region in said second body region between said second source region and said substrate;

a second gate electrode disposed atop said upper surface and overlying and being insulated from said second channel region and being operable to invert said second channel region in response to said suitable gate voltage supplied thereto;

at least one first connecting electrode disposed atop said upper surface and overlying at least a portion of said second source region, said second body region and said base region, so that when said suitable gate voltage is applied to said second gate electrode, said base region is electrically coupled to said substrate; and an anode contact formed on said lower surface of said substrate.

12. The device of claim 11 wherein said first body region includes a lower portion that is more heavily doped than a remaining portion that is adjacent to said upper surface.

13. The device of claim 11 further comprising a third source region of said second conductivity type formed in said active region at said upper surface and being located adjacent to said base region; a depletion channel region formed in said active region at said upper surface and being located between said third source region and said first body region; and a third gate electrode disposed atop said upper surface and overlying and being insulated from said depletion channel region.

14. The device of claim 13 wherein said first, second and third gate electrodes are electrically coupled and held at a same potential.

15. An emitter switched thyristor device comprising:

a substrate of a first conductivity type having substantially flat parallel upper and lower surfaces;

a base region of a second conductivity type formed in an upper surface of said substrate;

an active region of said first conductivity type formed in said base region at said upper surface, said active region including a buried emitter region formed along at least a portion of a boundary between said active region and said base region and being more heavily doped than a remaining portion of said active region;

at least one first body region of said second conductivity type formed in said active region at said upper surface;

at least one first source region of said first conductivity type formed in said body region at said upper surface and forming a first channel region in said body region between said first source region and said active region;

at least one first gate electrode disposed atop said upper surface and overlying and insulated from said first channel region and operable to invert said first channel region in response to a suitable gate voltage supplied thereto;

at least one cathode electrode disposed atop said upper surface and contacting said first source region;

a second body region of said second conductivity type formed in said upper surface of said substrate and being located adjacent to said base region;

a second source region of said first conductivity type formed in said second body region at said upper surface and forming a second channel region in said second body region between said second source region and said substrate;

a second gate electrode disposed atop said upper surface and overlying and being insulated from said second channel region and being operable to invert said second channel region in response to said suitable gate voltage supplied thereto;

at least one first connecting electrode disposed atop said upper surface and overlying at least a portion of said second source region, said second body region and said base region, so that when said suitable gate voltage is applied to said second gate electrode, said base region is electrically coupled to said substrate;

a third source region of said second conductivity type formed in said active region at said upper surface and being located adjacent to said base region;

a depletion channel region formed in said active region at said upper surface and being located between said third source region and said first body region;

a third gate electrode disposed atop said upper surface and overlying and being insulated from said depletion channel region; and an anode contact formed on said lower surface of said substrate.

16. The device of claim 15 wherein said first, second and third gate electrodes are electrically coupled and held at a same potential.

17. A bidirectional semiconductor device comprising:

a substrate of a first conductivity type having substantially flat parallel upper and lower surfaces;

a base region of a second conductivity type formed in an upper surface of said substrate;

an active region of said first conductivity type formed in said base region at said upper surface, said active region including a buried emitter region formed along at least a portion of a boundary between said active region and said base region and being more heavily doped than a remaining portion of said active region;

at least one first body region of said second conductivity type formed in said active region at said upper surface;

at least one source region of said first conductivity type formed in said body region at said upper surface and forming a first channel region in said body region between said first source region and said active region;

at least one first gate electrode disposed atop said upper surface and overlying and insulated from said first channel region and operable to invert said first channel region in response to a suitable gate voltage supplied thereto;

at least one cathode electrode disposed atop said upper surface and contacting said first body region and said first source region;

a second body region of said second conductivity type formed in said upper surface of said substrate and being located adjacent to said base region;

a second source region of said first conductivity type formed in said second body region at said upper surface and forming a second channel region in said second body region between said second source region and said substrate;

a second gate electrode disposed atop said upper surface and overlying and being insulated from said second channel region and being operable to invert said second channel region in response to said suitable gate voltage supplied thereto;

at least one first connecting electrode disposed atop said upper surface and overlying at least a portion of said second source region, said second body region and said base region, so that when said suitable gate voltage is applied to said second gate electrode, said base region is electrically coupled to said substrate;

a third source region of said second conductivity type formed in said active region at said upper surface and being located adjacent to said base region;

a depletion channel region comprising a third channel region formed in a third body region in said active region at said upper surface and being located between said third source region and said first body region;

a third gate electrode disposed atop said upper surface and overlying and being insulated from said depletion channel region;

a fourth body region of said second conductivity type formed in said active region at said upper surface;

a fourth source region of said first conductivity type formed in said fourth body region and forming a fourth channel region in said fourth body region;

a fourth gate electrode disposed atop said upper surface and overlying and being insulated from said fourth channel region;

a fifth body region of said second conductivity type formed in said substrate at said upper surface;

a fifth source region of said first conductivity type formed in said fifth body region at said upper surface and forming a fifth channel region in said fifth body region between said fifth source region and said substrate;

a fifth gate electrode disposed atop said upper surface and overlying and being insulated from said fifth channel region;

said first, second and third gate electrodes being held at a potential of a first polarity, and said fourth and fifth gate electrodes being held at a potential of a second polarity opposite to said first polarity;

a second connecting electrode for connecting said fourth and fifth source regions; and an anode contact formed on said lower surface of said substrate.

* * * * *